(12) United States Patent
Li

(10) Patent No.: US 9,431,241 B2
(45) Date of Patent: Aug. 30, 2016

(54) METHOD FOR MANUFACTURING A SILICON NITRIDE THIN FILM USING PLASMA-ENHANCED CHEMICAL VAPOR DEPOSITION

(71) Applicant: CSMC TECHNOLOGIES FAB1 CO., LTD., Jiangsu (CN)

(72) Inventor: Zhanxin Li, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/411,999

(22) PCT Filed: Jul. 30, 2013

(86) PCT No.: PCT/CN2013/080426
§ 371 (c)(1),
(2) Date: Dec. 30, 2014

(87) PCT Pub. No.: WO2014/019499
PCT Pub. Date: Feb. 6, 2014

(65) Prior Publication Data
US 2015/0179437 A1    Jun. 25, 2015

(30) Foreign Application Priority Data

Jul. 30, 2012  (CN) .......................... 2012 1 0266307

(51) Int. Cl.
*H01L 21/02*     (2006.01)
*C23C 16/34*     (2006.01)
*C23C 16/505*    (2006.01)

(52) U.S. Cl.
CPC ....... *H01L 21/02274* (2013.01); *C23C 16/345* (2013.01); *C23C 16/505* (2013.01); *H01L 21/0217* (2013.01); *H01L 21/02211* (2013.01)

(58) Field of Classification Search
CPC combination set(s) only.
See application file for complete search history.

(56) References Cited

U.S. PATENT DOCUMENTS 6,140,255 A * 10/2000 Ngo ...................... C23C 16/402
                                                          257/E21.035
2005/0170104 A1    8/2005 Jung et al.

FOREIGN PATENT DOCUMENTS

CN          101393869 A        3/2009

OTHER PUBLICATIONS

International Search Report (in Chinese with English Translation) for PCT/CN2013/080426, mailed Nov. 7, 2013; ISA/CN.

* cited by examiner

*Primary Examiner* — Mohammad Islam
*Assistant Examiner* — Charles R Peters
(74) *Attorney, Agent, or Firm* — Stephen T. Olson; Harness, Dickey & Pierce, P.L.C.

(57) ABSTRACT

A method for manufacturing a silicon nitride thin film comprises a step of charging silane, ammonia gas and nitrogen gas at an environment temperature below 350° C. to produce and deposit a silicon nitride thin film, wherein a rate of charging silane is 300-350 sccm, a rate of charging ammonia gas is 1000 sccm, a rate of charging nitrogen gas is 1000 sccm; a power of a high frequency source is 0.15~0.30 KW, a power of a low frequency source is 0.15~0.30 KW; a reaction pressure is 2.3~2.6 Torr; a reaction duration is 4~6 s. The above method for manufacturing a silicon nitride thin film provides a preferable parameter range and preferred parameters for generating a low-stress SIN thin film at low temperatures, achieves manufacture of a low-stress SIN thin film at low temperatures, and thus, better satisfies the situation requiring a low-stress SIN thin film.

20 Claims, 1 Drawing Sheet

METHOD FOR MANUFACTURING A SILICON NITRIDE THIN FILM USING PLASMA-ENHANCED CHEMICAL VAPOR DEPOSITION

CROSS REFERENCE TO RELATED APPLICATIONS

This application is a U.S. National Stage Application of International Application No. PCT/CN2013/080426 filed on Jul. 30, 2013, and published in Chinese as WO 2014/019499 A1 on Feb. 6, 2014. This application claims priority to Chinese Application No. 201210266307.7 filed on Jul. 30, 2012. The entire disclosures of the above applications are incorporated herein by reference.

FIELD OF INVENTION

The present invention relates generally to semiconductor process, and more particularly to a method for producing a silicon nitride thin film.

BACKGROUND

SIN ($SiN_x$, silicon nitride) thin films, characterized by impressive performances such as high dielectric constant, high insulation strength, low electric leakage, etc, are widely applied in microelectronic process for passivation, isolation, capacitance dielectric, etc. In addition, SIN films are also superior in terms of mechanical performance and stability.

The stress of SIN thin film is usually controlled within 100~200 MPa. In deposition of SIN thin films in a microelectronic mechanical system (MEMS) or other special technical process, SIN thin film with lower stress, such as 0±50 MPa, are required.

Most SIN films produced by a process of chemical vapor deposition (CVD) have the problem of relatively high mechanical stress, especially those produced by a process of low pressure chemical vapor deposition (LPCVD), whereby the SIN film can only be deposited up to 300 nm in thickness and may fracture or even drop off when the thickness is beyond 300 nm.

An SIN thin film produced by a process of Plasma-enhanced chemical vapor deposition (PECVD) is in a better situation in terms of stress than that produced by LPCVD, but it is subject to major influence by various processing conditions. The influencing factors include temperature, gas flow ratio, reaction pressure, etc.

The traditional method for eliminating stress of an SIN film produced by the PECVD process is to employ two power sources with different frequencies to eliminate stress difference. The high frequency source has a frequency of scores of megahertz (MHz), and the low frequency source has a frequency ranging from scores to hundreds of kilohertz (KHz). Since low-frequency plasma generates compressive stress, and high-frequency plasma generates tensile stress, the compressive stress and the tensile stress may be mutually offset by adjusting the power ratio of the high frequency source to the low frequency source to enable the two power sources to operate alternatively, thereby reducing or eliminating stress.

However, for some machines, it is impossible to successively reduce stress by simply adjusting the power ratio of the high frequency source to the low frequency source while some other processing conditions have to meet specific requirements. That is, however the power ratio of the high frequency source to the low frequency source is adjusted, it is impossible to reduce the stress to a level as specifically required.

In particular, the deposition of an SIN thin film on a NOVELLUS C1 machine usually needs to be carried out at a low temperature (below 350° C.). In such situation, it is no longer sufficient to meet the requirement by simply adjusting the power of the high frequency power source and the low frequency power source.

SUMMARY OF THE INVENTION

In view of the foregoing, it is necessary to provide a method for manufacturing a silicon nitride thin film with a stress within 50± MPa at a low temperature below 350° C.

A method for manufacturing a silicon nitride thin film comprises a step of charging silane, ammonia gas and diluent gas at an environment temperature below 350° C. to produce and deposit a silicon nitride thin film, wherein a rate of charging silane is 300~350 sccm, and a rate of charging ammonia gas is 1000 sccm; a power of a high frequency source is 0.15~0.30 KW and a power of a low frequency source is 0.15~0.30 KW; a reaction pressure is 2.3~2.6 Torr; and a reaction duration is 4~6 s.

In an embodiment, the environment temperature is 300° C.

In an embodiment, the rate of charging silane is 340 sccm, and the rate of charging ammonia gas is 1000 sccm; the power of the high frequency source is 0.18 KW and the power of the low frequency source is 0.25 KW; the reaction pressure is 2.6 Torr; and the reaction duration is 5 s.

In an embodiment, the diluent gas is nitrogen gas.

In an embodiment, the rate of charging nitrogen gas is 1000 sccm.

The above-mentioned method for manufacturing a silicon nitride thin film gives a preferable parameter range and preferred parameters for producing a low stress silicon nitride thin film at low temperatures, achieves manufacture of a low stress silicon nitride thin film at low temperatures, and thus, better satisfies the situation requiring a low-stress silicon nitride thin film.

DETAILED DESCRIPTION

In the following discussion, a method for manufacturing a silicon nitride thin film is further described in conjunction with the accompanying drawings and embodiments.

A method for manufacturing a silicon nitride thin film according to this embodiment is based on a process of plasma-enhanced chemical vapor deposition (PECVD) which involves regulation of temperature, gas flow, reaction pressure, and high frequency power and low frequency power of a power source to make the silicon nitride thin film have a relatively low stress. In this embodiment, the silicon nitride thin film is made to have a low stress of ±50 MPa.

Figure 1:
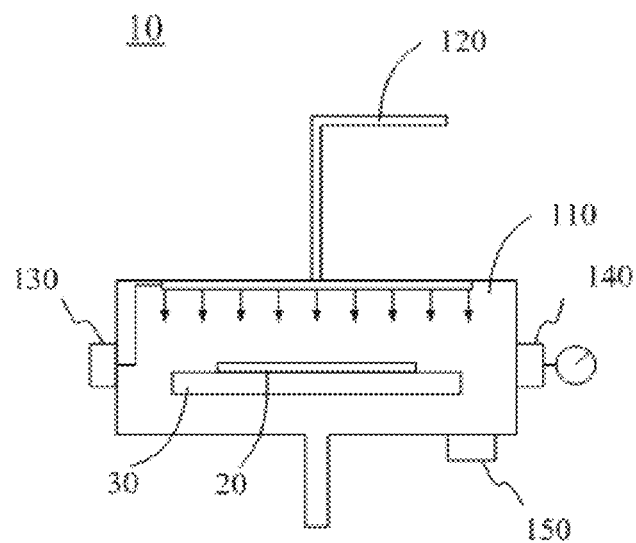
FIG. 1 illustrates a structure schematic diagram of a PECVD deposition machine.

FIG. 1 illustrates a structure schematic diagram of a PECVD deposition machine. A deposition machine 10 comprises a reaction chamber 110, a gas inlet pipeline 120, a power source 130, an air pressure controller 140, a temperature regulator 150, etc.

A wafer 20 to be processed is placed on a substrate 30. The wafer 20 together with the substrate 30 is disposed in the reaction chamber 110. By adjusting temperature, air pressure and power, an environment for generating silicon nitride is formed in the reaction chamber 110.

Various reaction gases may be charged via the gas inlet pipeline 120. In this embodiment, specifically, the reaction gases include silane ($SiH_4$) and ammonia gas ($NH_3$), wherein nitrogen gas ($N_2$) is used as the diluent gas. The gas inlet pipeline 120 shown in FIG. 1 is only for schematic purpose, and in fact, the gas inlet pipeline should at least include gas pipelines for the above mentioned three gases and a gas mixing chamber.

The power source 130 adopts a specific ratio of high frequency power to low frequency power to generate plasma.

The air pressure controller 140 and the temperature regulator 150 adjust and control the air pressure and the temperature in the reaction chamber 110, respectively.

Based on experiments and theories, the stress of SIN resulting from the PECVD process is closely related to the process conditions such as temperature, gas flow, reaction pressure, etc, which is reflected by physical parameters of the deposited film per se such as the H content, refraction index, Si/N ratio and compactness, etc of the film.

In this embodiment, it is required that a silicon nitride thin film with a stress within ±50 MPa be generated at a low temperature of 350° C., especially 300° C. Since $SiH_4$ experiences a sharper decrease in reactivity at a low temperature than $NH_3$, the direction of parameter regulation becomes difficult to predict as compared to the prior high-temperature reaction condition.

In this embodiment, a NOVELLUS C1 is taken as example, a preferable parameter range and preferred parameters for generating the above mentioned low-stress SIN thin film at a low temperature are provided.

Specifically:

the rate of charging silane is 300~350 sccm, the rate of charging ammonia gas is 1000 sccm, and the rate of charging nitrogen gas is 1000 sccm;

the power of the high frequency source is 0.15~0.30 KW and the power of the low frequency source is 0.15~0.30 KW;

the reaction pressure is 2.3~2.6 Torr; and the reaction duration is 4~6 s.

Wherein, sccm is a common unit used in semiconductor process, meaning standard-state cubic-centimeter per minute, that is, cubic-centimeter per minute at normal temperature and normal pressure, and it is a unit of gas charging rate. Torr is a unit of air pressure, that is, millimeter of mercury. 1 Torr equals 1.33 MPa, and 2.3~2.6 Torr equals 3.06~3.46 MPa.

Preferably:

the rate of charging silane is 340 sccm, the rate of charging ammonia gas is 1000 sccm, and the rate of charging nitrogen gas is 1000 sccm;

the power of the high frequency source is 0.18 KW and the power of the low frequency source is 0.25 KW;

the reaction pressure is 2.6 Torr; and the reaction duration is 5 s.

Figure 2:
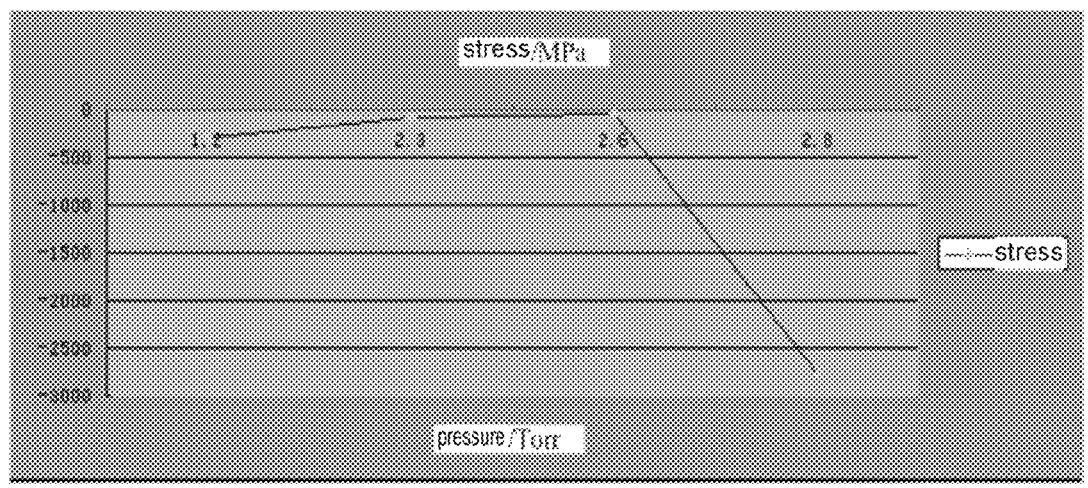
FIG. 2 illustrates a line chart of pressure-stress corresponding to a method for manufacturing a silicon nitride thin film according to one embodiment.

FIG. 2 illustrates a line chart of pressure-stress, wherein the rate of charging silane is 340 sccm, the rate of charging ammonia gas is 1000 sccm, and the rate of charging nitrogen gas is 1000 sccm; the power of the high frequency source is 0.18 KW and the power of the low frequency source is 0.25 KW.

As can be seen, the SIN thin film produced when the reaction pressure is 2.3~2.6 Torr has a low stress, with the stress hitting the lowest level at 2.6 Torr but increasing rapidly after the pressure is over 2.6 Torr.

Although by observing the relationship of the stress of SIN thin film with temperature, gas flow, reaction pressure and high to low frequency power ratio, respectively, a general trend of stress change with the adjustment of various parameters may be acquired, when it comes to a specific machine, the menu adjustment may be subject to influence from various factors. The interaction among various factors may make it hard to predict the choice of processing conditions, and during adjustment, the trend of stress change may reverse, making it difficult for the stress to meet the requirement.

The abovementioned embodiment provides a preferable parameter range and preferred parameters for generating a low-stress SIN thin film at low temperatures, achieves manufacture of a low-stress SIN thin film at low temperatures, and thus, better satisfies the situation requiring a low-stress SIN thin film.

The abovementioned embodiments merely express several modes of implementation of the present invention, with descriptions that are relatively specific and detailed, but it shall not be interpreted that they may limit the scope of the present invention. It should be noted that a person of ordinary skill in the art could make several transformations and improvements which fall into the protection scope of the present invention without departing from the spirit of the present invention. Therefore, the scope of protection of the present invention shall be determined by the attached claims.

What is claimed is:

1. A method for manufacturing a silicon nitride thin film comprising a charging silane, ammonia gas and diluent gas at an environment temperature below 350° C. to produce and deposit a silicon nitride thin film, wherein, a rate of charging silane is 300-350 sccm, and a rate of charging ammonia gas is 1000 sccm;

a power of a high frequency source is 0.15~0.30 KW and a power of a low frequency source is 0.15~0.30 KW;

a reaction pressure is 2.3~2.6 Torr; and a reaction duration is 4~6 s, wherein the silicon nitride thin film has a stress within 50±MPa at the temperature below 350° C.

2. The method for manufacturing a silicon nitride thin film according to claim 1, wherein the environment temperature is 300° C.

3. The method for manufacturing a silicon nitride thin film according to claim 1, wherein, the rate of charging silane is 340 sccm, and the rate of charging ammonia gas is 1000 sccm;

the power of the high frequency source is 0.18 KW and the power of the low frequency source is 0.25 KW;

the reaction pressure is 2.6 Torr; and the reaction duration is 5 s.

4. The method for manufacturing a silicon nitride thin film according to claim 1, wherein the diluent gas is nitrogen gas.

5. The method for manufacturing a silicon nitride thin film according to claim 4, wherein the rate of charging nitrogen gas is 1000 sccm.

6. The method for manufacturing a silicon nitride thin film according to claim 1, wherein the silicon nitride thin film has a stress within 50±MPa at a reaction pressure of 2.3 Torr.

7. The method for manufacturing a silicon nitride thin film according to claim 1, wherein the silicon nitride thin film has a stress within 50±MPa at a reaction pressure of 2.6 Torr.

8. The method for manufacturing a silicon nitride thin film according to claim 1, wherein the reaction duration is 4 s.

9. A method for manufacturing a silicon nitride thin film comprising a charging silane, ammonia gas and diluent gas at an environment temperature below 350° C. to produce and deposit a silicon nitride thin film, wherein,
- a rate of charging silane is 300-350 sccm, and a rate of charging ammonia gas is 1000 sccm;
- a power of a high frequency source is 0.15~0.30 KW and a power of a low frequency source is 0.15~0.30 KW;
- a reaction pressure is 2.3~2.6 Torr; and
- a reaction duration is 4~6 s,
- wherein the silicon nitride thin film has a stress within 50±MPa at a reaction pressure of 2.3 Torr.

10. The method for manufacturing a silicon nitride thin film according to claim 9, wherein the environment temperature is 300° C.

11. The method for manufacturing a silicon nitride thin film according to claim 9, wherein,
- the rate of charging silane is 340 sccm, and the rate of charging ammonia gas is 1000 sccm;
- the power of the high frequency source is 0.18 KW and the power of the low frequency source is 0.25 KW;
- the reaction pressure is 2.6 Torr; and
- the reaction duration is 5 s.

12. The method for manufacturing a silicon nitride thin film according to claim 9, wherein the diluent gas is nitrogen gas.

13. The method for manufacturing a silicon nitride thin film according to claim 9, wherein the rate of charging nitrogen gas is 1000 sccm.

14. The method for manufacturing a silicon nitride thin film according to claim 9, wherein the reaction duration is 4 s.

15. A method for manufacturing a silicon nitride thin film comprising a charging silane, ammonia gas and diluent gas at an environment temperature below 350° C. to produce and deposit a silicon nitride thin film, wherein,
- a rate of charging silane is 300-350 sccm, and a rate of charging ammonia gas is 1000 sccm;
- a power of a high frequency source is 0.15~0.30 KW and a power of a low frequency source is 0.15~0.30 KW;
- a reaction pressure is 2.3~2.6 Torr; and
- a reaction duration is 4~6 s,
- wherein the silicon nitride thin film has a stress within 50±MPa at a reaction pressure of 2.6 Torr.

16. The method for manufacturing a silicon nitride thin film according to claim 15, wherein the environment temperature is 300° C.

17. The method for manufacturing a silicon nitride thin film according to claim 15, wherein,
- the rate of charging silane is 340 sccm, and the rate of charging ammonia gas is 1000 sccm;
- the power of the high frequency source is 0.18 KW and the power of the low frequency source is 0.25 KW;
- the reaction pressure is 2.6 Torr; and
- the reaction duration is 5 s.

18. The method for manufacturing a silicon nitride thin film according to claim 15, wherein the diluent gas is nitrogen gas.

19. The method for manufacturing a silicon nitride thin film according to claim 15, wherein the rate of charging nitrogen gas is 1000 sccm.

20. The method for manufacturing a silicon nitride thin film according to claim 15, wherein the reaction duration is 4 s.

* * * * *